US012677643B2

(12) United States Patent
Li

(10) Patent No.: US 12,677,643 B2
(45) Date of Patent: Jul. 7, 2026

(54) METHOD FOR REDUCING CRITICAL DIMENSION OF PATTERNS GENERATED USING A LITHOGRAPHY TOOL

(71) Applicant: Silicon Laboratories Inc., Austin, TX (US)

(72) Inventor: Jiye Li, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 463 days.

(21) Appl. No.: 18/212,854

(22) Filed: Jun. 22, 2023

(65) Prior Publication Data

US 2024/0429053 A1      Dec. 26, 2024

(51) Int. Cl.
H10P 76/40          (2026.01)
H10D 64/01          (2025.01)
H10P 50/00          (2026.01)

(52) U.S. Cl.
CPC ......... H10P 76/4085 (2026.01); H10D 64/01 (2025.01); H10P 50/71 (2026.01); H10P 50/73 (2026.01); H10P 76/405 (2026.01)

(58) Field of Classification Search
CPC ........... H01L 21/0332; H01L 21/31144; H01L 21/28132
See application file for complete search history.

(56) References Cited

U.S. PATENT DOCUMENTS

| | | | |
|---|---|---|---|
| 6,583,036 B1 | 6/2003 | Hayamizu | |
| 9,165,765 B1 | 10/2015 | Raley et al. | |
| 9,318,369 B2 | 4/2016 | Park | |
| 9,443,731 B1 | 9/2016 | O'Meara et al. | |
| 2012/0128935 A1 | 5/2012 | Dunn et al. | |
| 2014/0017899 A1 | 1/2014 | Wallace et al. | |

(Continued)

FOREIGN PATENT DOCUMENTS

| | | |
|---|---|---|
| WO | 2002078071 A2 | 10/2002 |

OTHER PUBLICATIONS

Ban, Y., et al., "Layout Decomposition of Self-Aligned Double Patterning for 2D Random Logic Patterning," Proceedings of the SPIE, vol. 7974 7970L—Apr. 1, 2011, 15 pages.

(Continued)

*Primary Examiner* — William B Partridge
*Assistant Examiner* — Felix B Andrews
(74) *Attorney, Agent, or Firm* — Zagorin Cave LLP

(57)          ABSTRACT

A technique for forming semiconductor structures having a critical dimension (CD) smaller than the minimum lithographic CD capability of an available lithography tool used to form structures on a substrate forms structures having that minimum lithographic CD and reduces the CD of those structures using non-lithographic techniques. A method for manufacturing an integrated circuit includes forming a first hard mask on a substrate by patterning a first layer of a first material. The method includes forming a second hard mask of a second material on the substrate by chemically modifying the first hard mask. The method includes forming a third hard mask by patterning a second layer of the first material on the substrate. The method includes forming a fourth hard mask of the second material on the substrate by chemically modifying the third hard mask.

20 Claims, 10 Drawing Sheets

(56)                    References Cited

U.S. PATENT DOCUMENTS

| | | | |
|---|---|---|---|
| 2015/0064912 A1* | 3/2015 | Jang | H10P 50/695 |
| | | | 438/696 |
| 2015/0087149 A1* | 3/2015 | He | H10P 76/4088 |
| | | | 438/696 |
| 2016/0334709 A1 | 11/2016 | Huli et al. | |
| 2020/0135575 A1 | 4/2020 | Greene et al. | |
| 2021/0020440 A1 | 1/2021 | He et al. | |
| 2021/0193810 A1* | 6/2021 | Xu | H10D 30/6892 |
| 2022/0020865 A1* | 1/2022 | Chen | H10D 30/024 |
| 2023/0045826 A1* | 2/2023 | Su | H10P 50/73 |

OTHER PUBLICATIONS

Altamirano-Sanchez, E., et al., "Self-Aligned Quadruple Patterning to Meet Requirements for Fins with High Density," SPIE Digital Library, May 14, 2016, 5 pages.
Tech Design Forums, Sphere: "Triple Patterning and Self-Aligned Double Patterning (SAPD)," downloaded from https://www.techdesignforums.com/practice/sphere/technologies/ on Mar. 23, 2023, 3 pages.
Wikipedia, "Multiple Patterning," downloaded from https://en.wikipedia.org/w/index.php?title=Multiple_patterning&oldid=1157255408 on Jun. 6, 2023, 17 pages.

* cited by examiner

METHOD FOR REDUCING CRITICAL DIMENSION OF PATTERNS GENERATED USING A LITHOGRAPHY TOOL

BACKGROUND

Field of the Invention

The invention relates to semiconductor device fabrication and more particularly to forming patterned layers on a semiconductor substrate.

Description of the Related Art

In general, semiconductor device fabrication achieves high densities of transistors on a substrate by using extreme ultraviolet (EUV) lithography (e.g., 10-121 nm lithography) to form structures having small critical dimensions (i.e., CDs, e.g., line widths or feature widths). For example, semiconductor device fabrication processes that define minimum polysilicon lengths, active widths, or metal length of 28 nm or smaller use EUV lithography to define those CD patterns. However, EUV lithography tools are expensive and are in limited supply. Accordingly, other techniques for forming semiconductor structures having small CDs on a substrate to achieve a high transistor density are desired.

SUMMARY OF EMBODIMENTS OF THE INVENTION

In at least one embodiment, a method for manufacturing an integrated circuit includes forming a first hard mask on a substrate by patterning a first layer of a first material. The first hard mask has first features with a first critical dimension. The method includes forming a second hard mask of a second material on the substrate by chemically modifying the first hard mask. The second hard mask has second features with a second critical dimension. The second critical dimension is smaller than the first critical dimension. The method includes forming a third hard mask by patterning a second layer of the first material on the substrate. The third hard mask has third features with the second critical dimension. The method includes forming a fourth hard mask of the second material on the substrate by chemically modifying the third hard mask. The fourth hard mask has fourth features with a third critical dimension. The third critical dimension is smaller than the second critical dimension.

In at least one embodiment, a method for manufacturing an integrated circuit includes forming a first hard mask by lithographically patterning a first sacrificial layer formed on a substrate. The first hard mask has first features with a first critical dimension. The method includes serially forming additional hard masks by chemically modifying the first hard mask and a first intermediate hard mask of the additional hard masks. A final hard mask of the additional hard masks has a second critical dimension. The second critical dimension is smaller than one half the first critical dimension.

In at least one embodiment, a method for manufacturing an integrated circuit includes using a lithographic process defined by a first minimum feature size of a first critical dimension to form a first hard mask from a first sacrificial layer on a substrate. The method includes generating a final hard mask using the first hard mask. The final hard mask has a second critical dimension. The second critical dimension is smaller than one half the first critical dimension. The final hard mask may be generated by serially reducing corresponding minimum feature sizes by chemical modification of the first sacrificial layer formed on the substrate and an additional sacrificial layer formed on the substrate.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique forms semiconductor structures having CDs smaller than the minimum lithographic CD achievable by an available lithography tool used to form structures on a substrate. The technique forms structures having that minimum lithographic CD and reduces the CD of those structures using non-lithographic techniques. The available lithography tool may be a lower-end model, and thus less expensive and more abundant, than a state-of-the-art lithography tool and forms structures having a minimum lithographic CD that is greater than twice the minimum lithographic CD of a current state of the art lithography tool.

In at least one embodiment, a method for manufacturing a semiconductor device uses an available lithography tool having a minimum lithographic CD larger than two times the CD of a final semiconductor feature. The technique uses polysilicon as a hard mask, grows silicon dioxide (i.e., oxide) using the polysilicon hard mask to shrink the length of the polysilicon, and then further reduces the length of the polysilicon. For example, an available lithography tool having a minimum lithographic CD of 56 nm is used to generate semiconductor structures having CDs of approximately 14 nm. The technique can be applied using an available lithography tool having a minimum lithographic CD of another width to generate semiconductor structures (e.g., polysilicon length, active areas, contact and metal CD, or other semiconductor structures) having CDs smaller than one half the width of the other minimum lithographic CD (e.g., an available lithography tool used to define 90 nm, 40 nm, or 28 nm polysilicon lengths can be used to generate polysilicon lengths of 22 nm, 10 nm, or 7 nm, respectively).

Figure 1A:
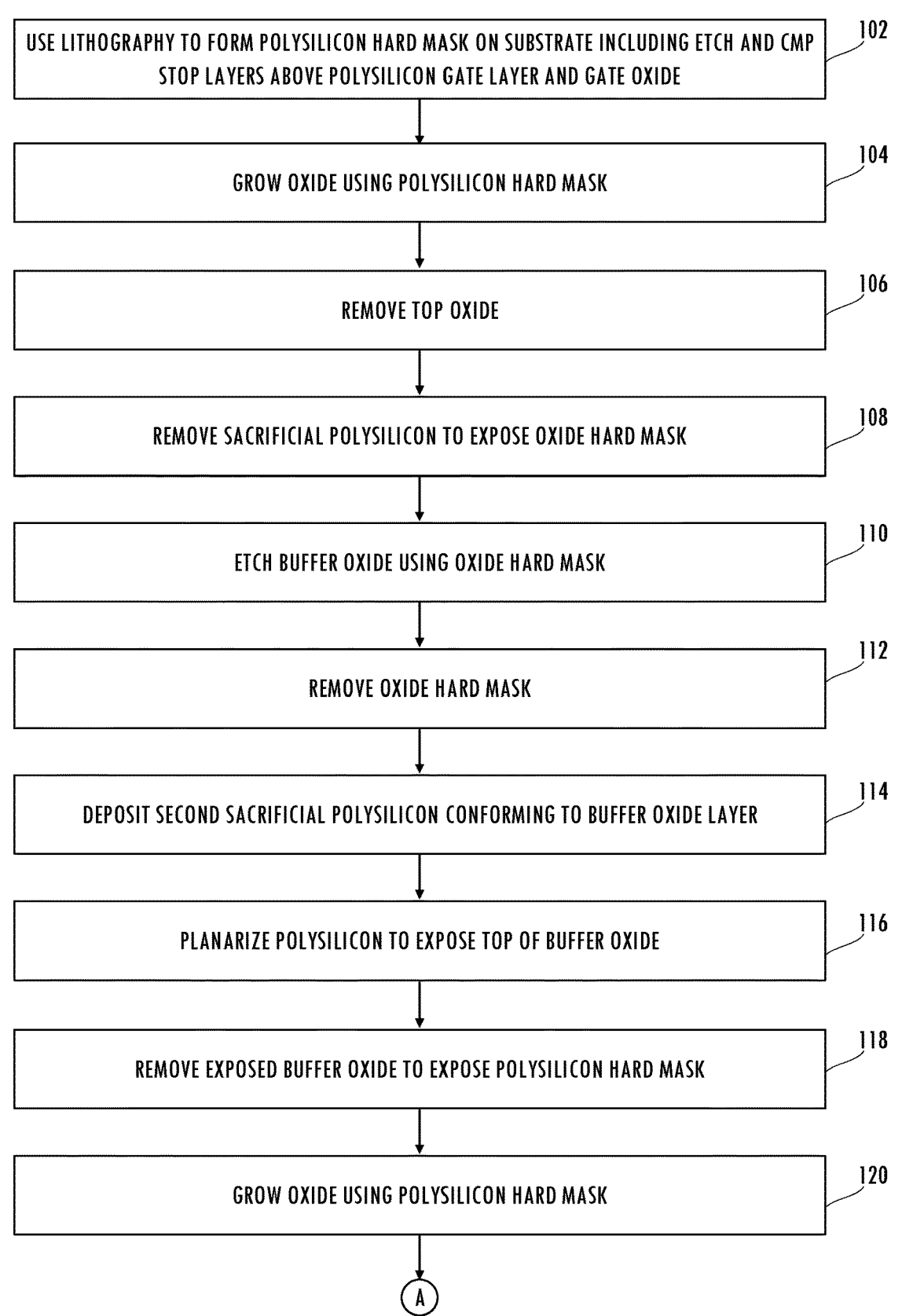
FIGS. 1A and 1B illustrate a process flow for manufacturing an integrated circuit consistent with at least one embodiment of the invention.
Figure 2A:
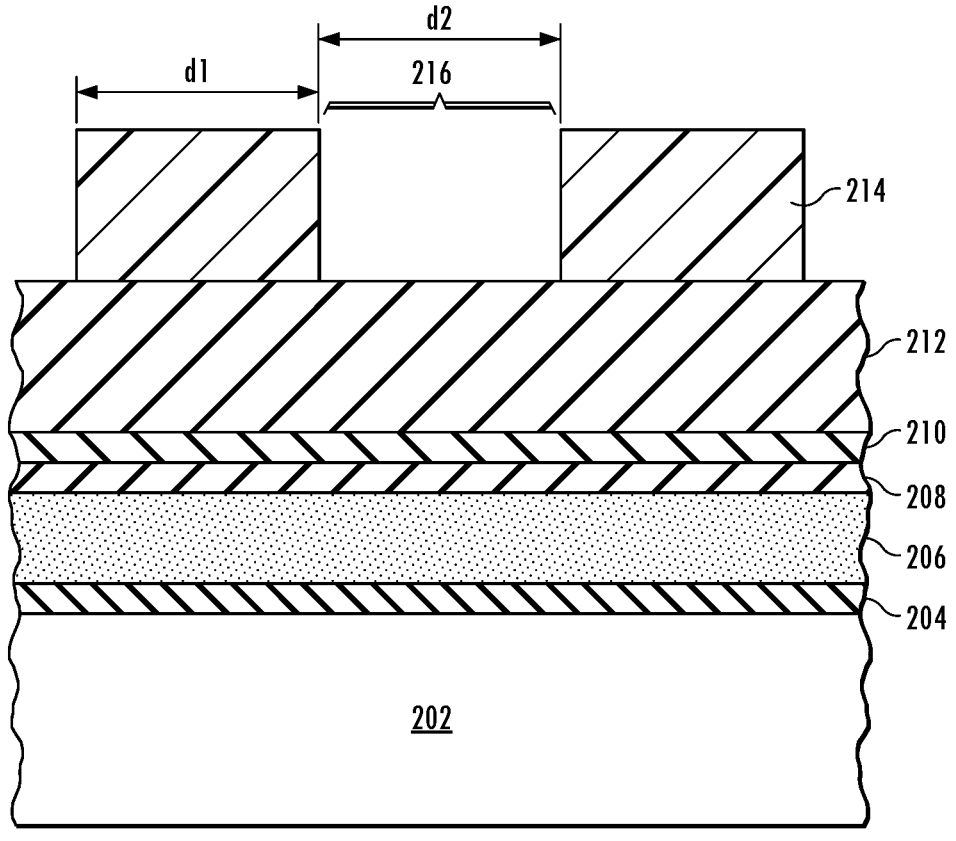
FIGS. 2A-2M illustrate cross-sectional views of structures formed by sequential steps for manufacturing a device on a semiconductor substrate consistent with at least one embodiment of the invention.

Referring to FIGS. 1A and 2A, in at least one embodiment, an available lithography tool is used to form a polysilicon hard mask on a substrate. In an embodiment, the available lithography tool is a lower end tool than a state-of-the-art lithography tool. The substrate has already been processed to include etch and chemical mechanical stop layers, or other appropriate sacrificial layers, above a polysilicon layer, which is above a gate oxide layer. The polysilicon layer and gate oxide layer are used to form a gate electrode or other structure of an integrated circuit device (102). In other embodiments, other sacrificial layers may be used. In at least one embodiment, substrate 202 is a semiconductor substrate (e.g., a substrate formed from silicon, germanium, other semiconducting material, or a compound semiconductor material such as gallium-arsenide) and includes multiple layers that are formed on substrate 202. In at least one embodiment, gate oxide layer 204, polysilicon layer 206, buffer oxide layer 208, silicon nitride layer 210, and buffer oxide layer 212 are formed on substrate 202. In addition, a first sacrificial polysilicon layer is patterned using the available lithography tool to form polysilicon hard mask 214 on the layers on substrate 202.

In an embodiment, gate oxide layer 204 has a thickness in a range of 2-20 nm and is formed by a conventional semiconductor manufacturing technique, e.g., thermal oxidation of a silicon substrate. Polysilicon layer 206 is a layer of polysilicon having a thickness in a range of 50-150 nm, and is formed by a conventional semiconductor manufacturing technique, e.g., using a furnace deposition process. In an embodiment, buffer oxide layer 208, is a layer of tetraethyl orthosilicate (TEOS) that is formed by low pressure chemical vapor deposition (LPCVD) and has a thickness in a range of 20-100 nm. Silicon nitride layer 210, having a thickness in a range of 20-100 nm, is a layer of silicon nitride (i.e., $Si_3N_4$) formed by a furnace deposition process. In an embodiment, buffer oxide layer 212 is a TEOS layer having a thickness in a range of 50-150 nm and is formed by LPCVD. Note that other embodiments may use other materials having different thicknesses and formed by other semiconductor processing techniques.

In an embodiment, polysilicon hard mask 214 is formed by first forming a polysilicon layer having a thickness in a range of 50-150 nm and using the available lithography tool to pattern the polysilicon layer to form the polysilicon hard mask. For example, a photoresist layer is formed on the polysilicon layer, e.g., by spin coating the wafer and prebaking the coated wafer. The available lithography tool exposes the coated wafer to light that is projected onto the coated wafer through a photomask and ultra-high-performance lenses to form a pattern on the coated wafer. Following a post-exposure bake and development, polysilicon hard mask 214 including void 216 remains on the substrate. In at least one embodiment, the polysilicon hard mask has a CD of width d1, e.g., equal to 56 nm, for lines and a width of d2, e.g., 56 nm, for voids between the lines. In at least one embodiment, width d1 is equal to width d2, although in other embodiments, widths d1 and d2 have different dimensions.

Figure 2B:
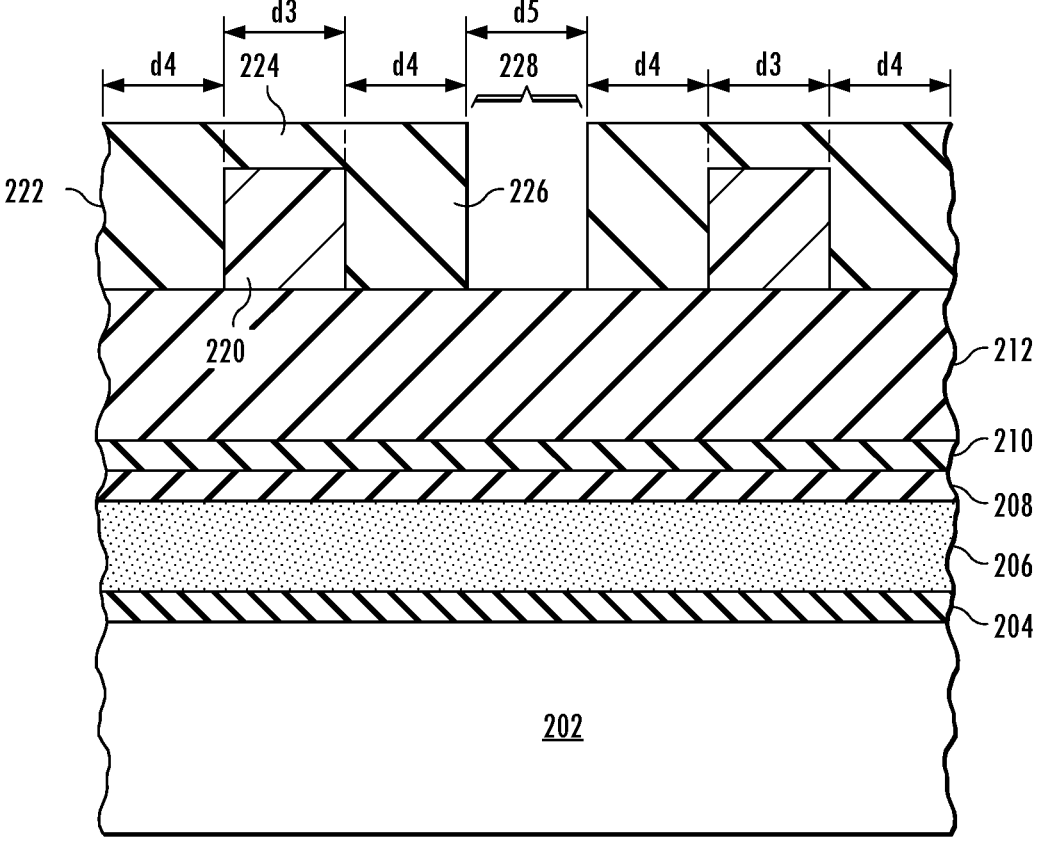

Referring to FIGS. 1A and 2B, the polysilicon hard mask is used to grow oxide (104). For example, the polysilicon hard mask is a patterned polysilicon layer that originally includes structures of a first composition having two sidewalls and a top surface. The sidewall and top surfaces are exposed to a chemical environment that chemically modifies the exposed surfaces of the sidewall and the exposed top surfaces to a predetermined depth, thereby creating chemically modified sidewalls and a top portion of another composition. Growth of an oxide of thickness d consumes a layer of polysilicon with a thickness of 0.46 d. In at least one embodiment, consumption of 1 Å of polysilicon grows approximately 2 Å (e.g., 2.17 Å) of oxide. In at least one embodiment, the chemical environment is an oxygen-containing environment, e.g., an environment containing molecular oxygen, carbon monoxide, carbon dioxide, or nitrogen dioxide. In at least one embodiment, the chemical environment includes several percent of hydrochloric acid, hydrogen chloride, or trichloroethylene. The chlorine removes metal ions that may occur in the oxide. The time required to grow an oxide of a particular thickness at a constant temperature on a bare silicon surface may be determined using the Deal-Grove model or the Massoud model known in the art. In at least one embodiment, wet oxidation (e.g., oxidation using water vapor), which has a higher growth rate, is used. In at least one embodiment, a combination of wet and dry oxidation is used, e.g., a dry-wet-dry cycle.

Figure 2C:
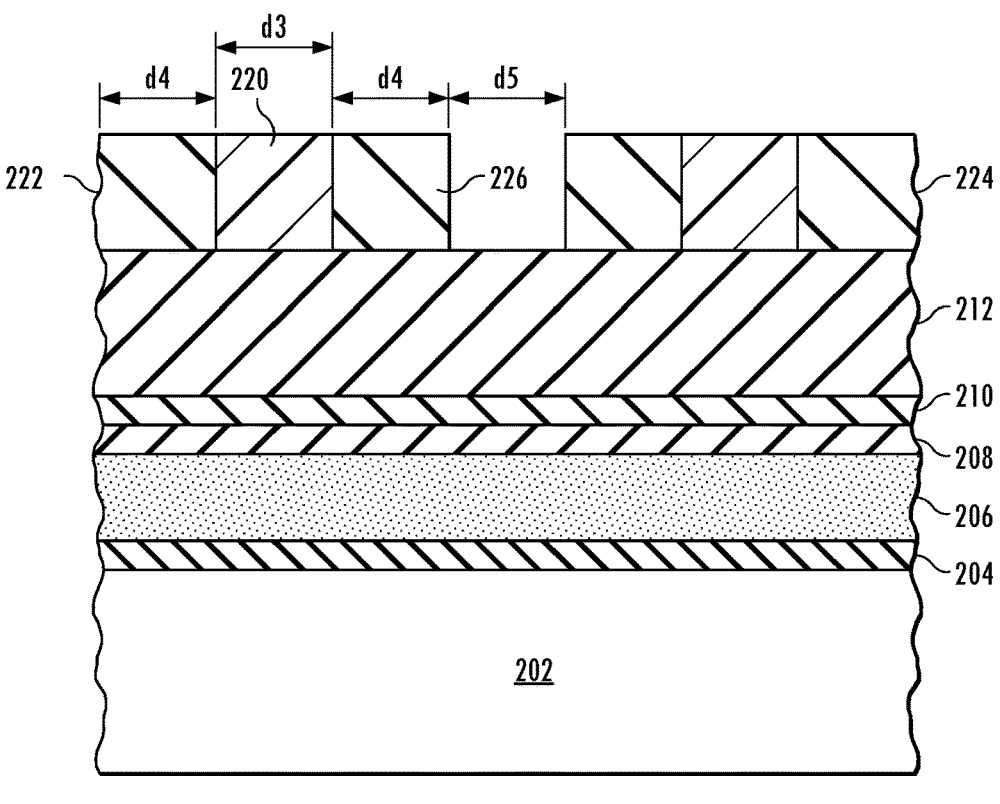

The structures after oxidation include oxide sidewalls 222 and 226, each having width d4, oxide cap 224, and polysilicon mandrel 220 having width d3. In an embodiment, width d3 (e.g., 28 nm) is approximately equal to width d4 (e.g., 28 nm). In other embodiments, width d3 is different from width d4. Sidewall 226 is spaced by width d5 from a next adjacent sidewall. In an embodiment, width d5 (e.g., 28 nm) is approximately equal to width d4, but in other embodiments, width d5 is different from width d4. Next, the top oxide, including oxide cap 224 is removed while leaving oxide sidewalls 222 and 226 (106). The top oxide may be removed using a dry etching process or other suitable technique (e.g., chemical mechanical planarization or polishing (CMP)). In at least one embodiment, the etching processes uses plasma created with oxygen, argon, carbon tetrafluoride, or other appropriate gases. FIG. 2C illustrates the resulting structure, which includes oxide sidewalls 222 and 226 (i.e., chemically modified portions) and polysilicon mandrel 220 (i.e., a nonmodified portion) having an exposed top surface.

Figure 2D:
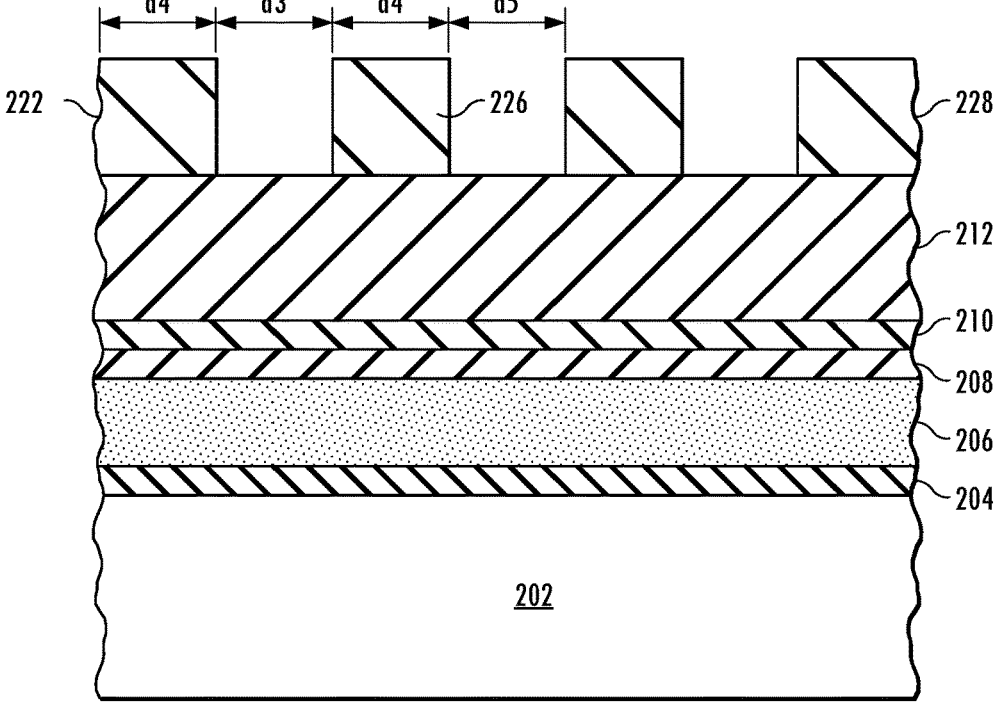
Figure 2E:
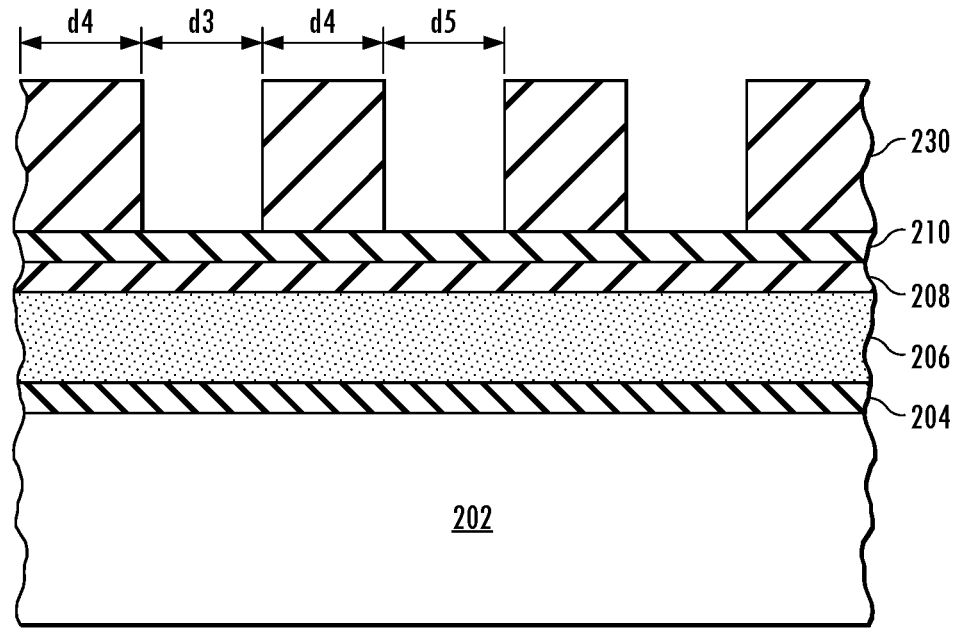

Referring to FIGS. 1A and 2C, polysilicon mandrel 220 is selectively etched down to buffer oxide layer 212 using a selective etching process to leave behind oxide sidewalls 222 and 226 (i.e., chemically modified portions) (108). In at least one embodiment, selective etching agents that etch polysilicon and do not substantially etch oxide are used. In a conventional dry etch process, the etch rate of polysilicon is substantially greater than the etch rate of oxide, e.g., greater than 100:1, thus only a negligible amount of oxide is lost. After the selective etch, sidewalls 222 and 226 form a second hard mask, oxide hard mask 228, as illustrated in FIG. 2D. Referring to FIGS. 1A and 2D, next, oxide hard mask 228 and a conventional semiconductor manufacturing technique (e.g., dry etch) are used to etch into buffer oxide layer 212 down to silicon nitride layer 210 (110). The dry etch also removes the oxide hard mask, thereby leaving only patterned buffer oxide layer 230 above silicon nitride layer 210 (112), as illustrated in FIG. 2E.

Figure 2F:
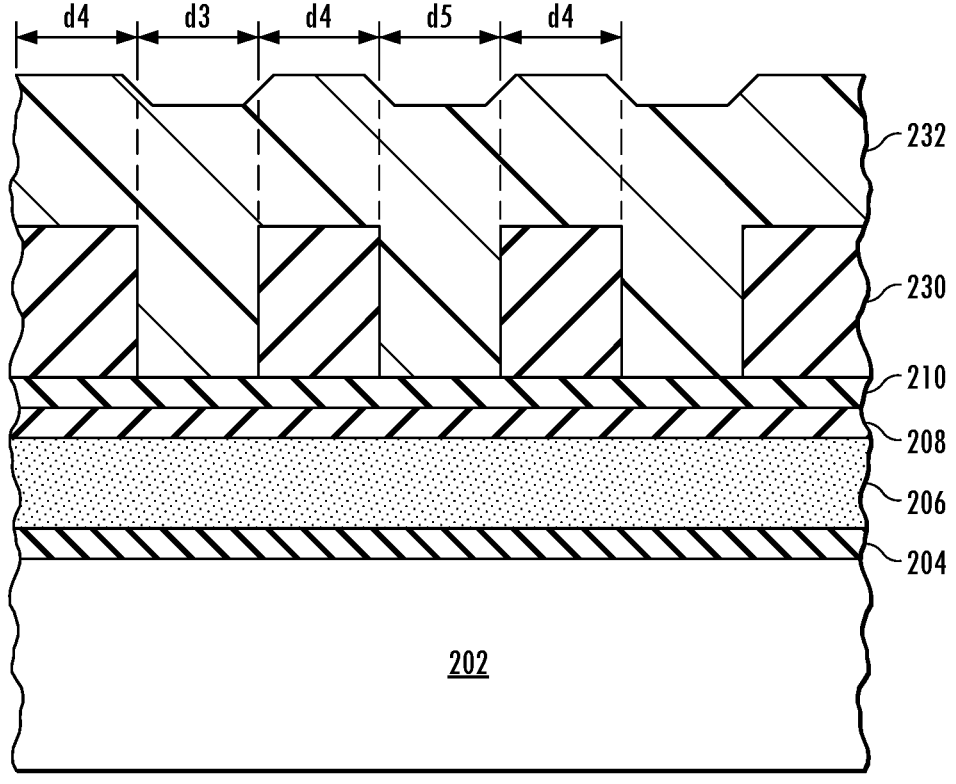
Figure 2G:
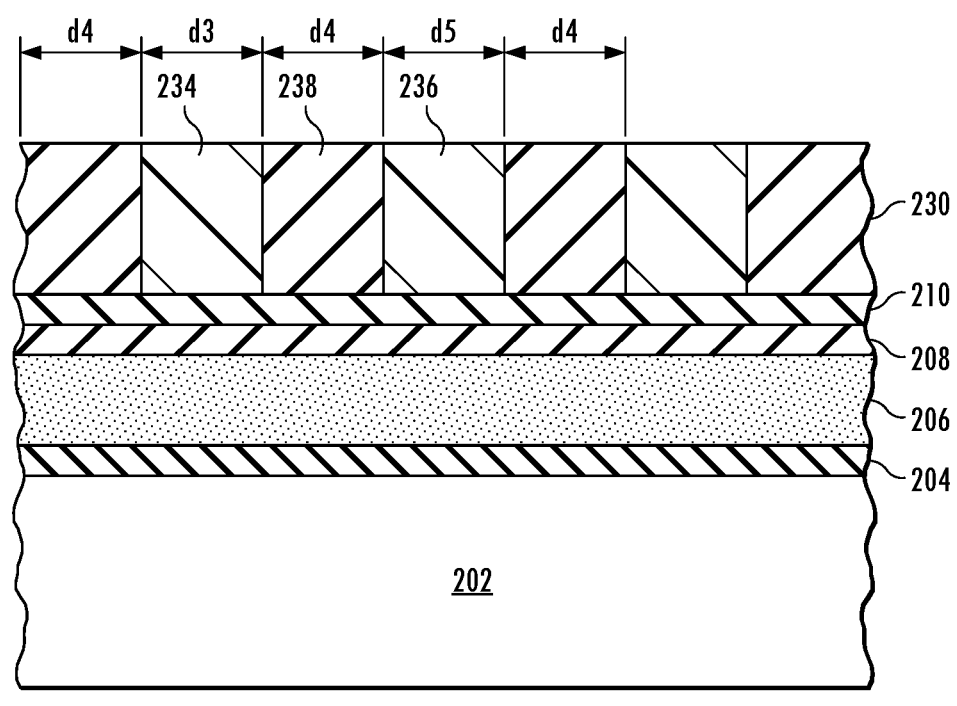

Referring to FIGS. 1A and 2F, a conventional semiconductor manufacturing technique, e.g., a furnace deposition process, forms a second sacrificial polysilicon layer having a thickness in a range of 50-150 nm and conforming to structures already existing on the substrate (114). Sacrificial polysilicon layer 232 fills in the voids in patterned buffer oxide layer 230. A planarization technique (e.g., CMP, or other suitable technique) removes top portions of sacrificial polysilicon layer 232, thereby exposing the top surface of patterned buffer oxide layer 230 with sacrificial polysilicon structures 234 and 236 in the gaps in patterned buffer oxide layer 230 (116), as shown in FIG. 2G.

Figure 2H:
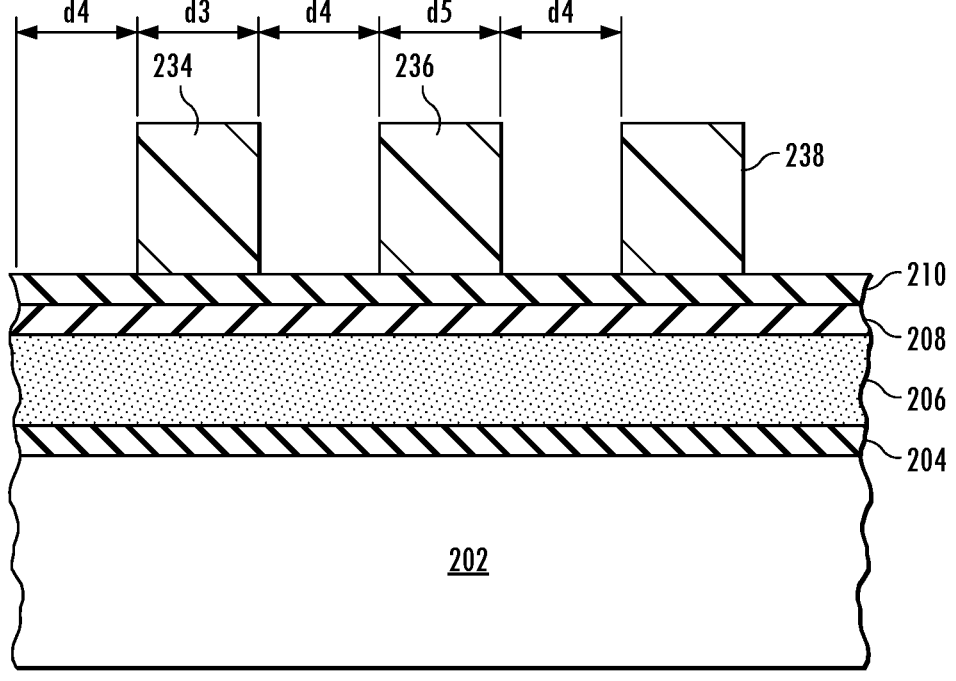

Referring to FIGS. 1A and 2H, a conventional semiconductor manufacturing technique, e.g., a selective etching process, removes patterned buffer oxide layer 230 down to silicon nitride layer 210, while preserving polysilicon hard mask 238, including structure 234 with width d3, and structure 236, having width d5, a void of width d4 between structures 234 and 236, and other sacrificial polysilicon structures that collectively form a third hard mask, polysilicon hard mask 238 (118). In a conventional dry etch process, the etch rate of oxide is substantially greater than the etch rate of polysilicon, e.g., greater than 100:1, thus only a negligible amount of polysilicon is lost.

Figure 2I:
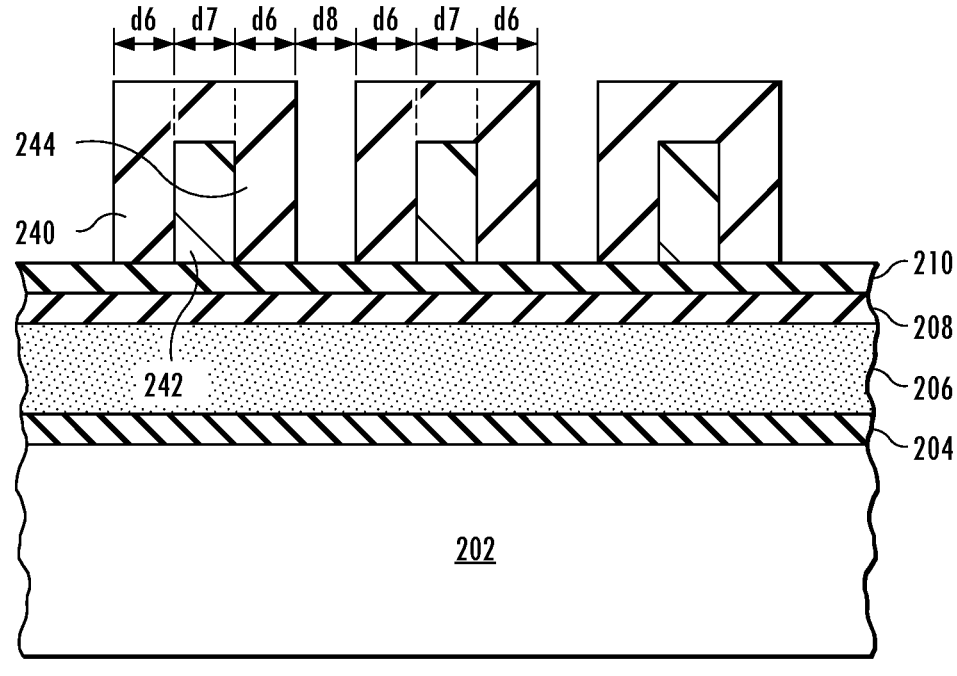

Referring to FIGS. 1A and 2I, a second chemically modifying step is performed that exposes the sidewall and top surfaces of the third hard mask to a chemical environment. The third hard mask is chemically modified and consumes surfaces of sidewalls and top surfaces of polysilicon to a predetermined depth in the polysilicon material (120). The exposure to the chemical environment creates a chemically modified sidewall having width d6 and cap layer of another composition surrounding polysilicon mandrel 242 having width d7. Growth of an oxide thickness of d consumes a layer of polysilicon with a thickness of 0.46 d. In at least one embodiment, consumption of 1 Å of polysilicon grows approximately 2 Å (e.g., 2.17 Å) of oxide. In at least one embodiment, the chemical environment is an oxygen-containing environment, e.g., an environment containing molecular oxygen, carbon monoxide, carbon dioxide, or nitrogen dioxide. In at least one embodiment, the chemical environment includes several percent of hydrochloric acid, hydrogen chloride, or trichloroethylene. The chlorine removes metal ions that may occur in the oxide. The time required to grow an oxide of a particular thickness at a constant temperature on a bare silicon surface may be determined using the Deal-Grove model or the Massoud model known in the art. In at least one embodiment, wet oxidation, which has a higher growth rate, is used. In at least one embodiment, a combination of wet and dry oxidation is used, e.g., a dry-wet-dry cycle. In an embodiment, width d6 (e.g., 14 nm) of a sidewall is approximately equal to width d7 (e.g., 14 nm) of a corresponding mandrel, but in other embodiments, width d6 is different from width d7. Sidewall 244 is spaced by width d8 from a next adjacent sidewall. In an embodiment, width d7 (e.g., 14 nm) is approximately equal to width d8 (e.g., 14 nm), but in other embodiments, width d7 is different from width d8.

Figure 1B:
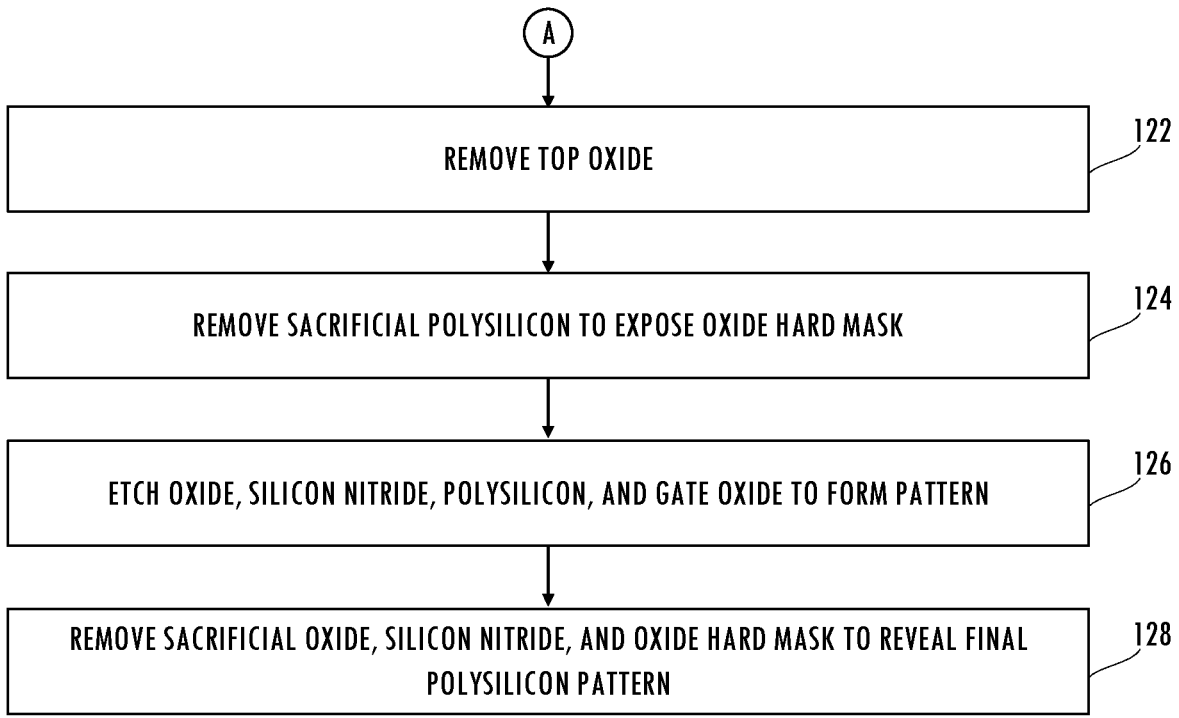
Figure 2J:
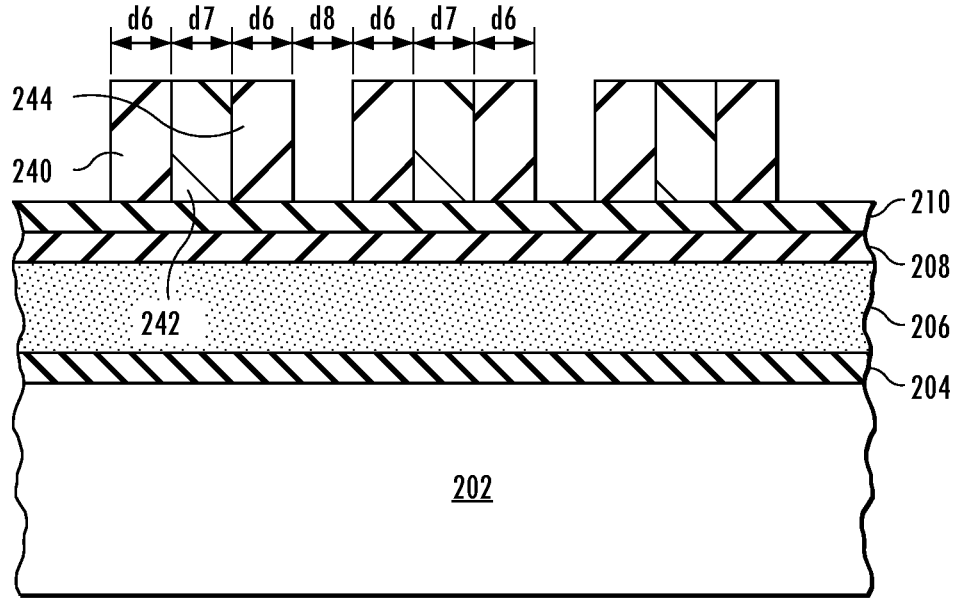
Figures 2K, 2L:
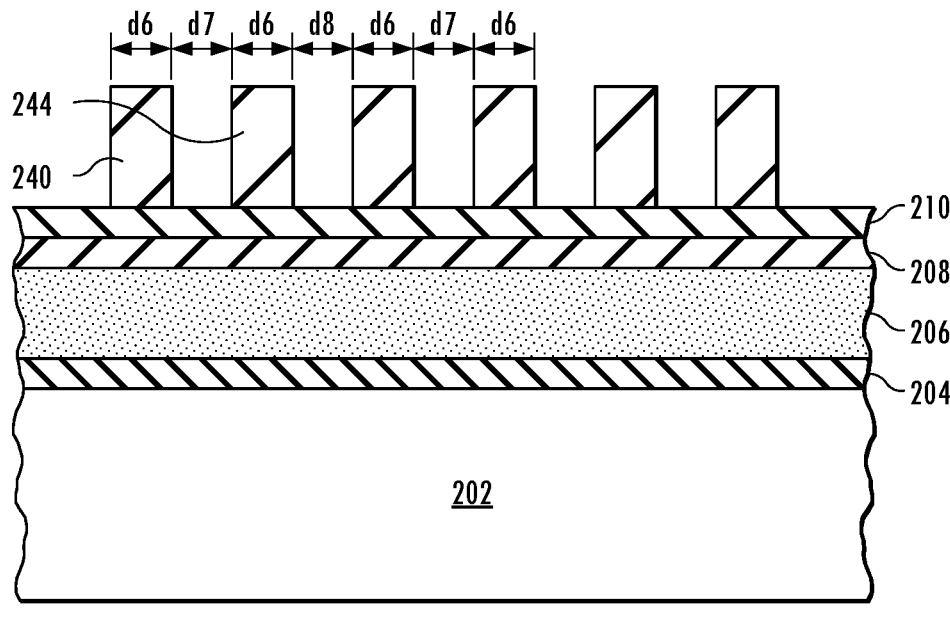

Referring to FIGS. 1B and 2I, next, the top of the oxide, including the oxide cap, is removed while leaving oxide sidewalls and the polysilicon mandrel (122). The top oxide may be removed using an etching process or other suitable technique. In at least one embodiment, the etching process uses plasma created with oxygen, argon, carbon tetrafluoride, or other appropriate gases. The resulting structure includes oxide sidewalls 240 and 244 (i.e., chemically modified portions) and polysilicon mandrel 242 (i.e., a nonmodified portion) having an exposed top, as illustrated in FIG. 2J. Next, polysilicon mandrel 242 is selectively removed using a selective etching process that etches down to silicon nitride layer 210 to leave behind the oxide sidewalls 240 and 244 (i.e., chemically modified portions) (124), as illustrated in FIGS. 1B and 2K. In at least one embodiment, etching agents that etch polysilicon and do not substantially etch silicon nitride are used (124). In a conventional dry etch process, the etch rate of silicon nitride is substantially greater than the etch rate of polysilicon, e.g., greater than 100:1, thus only a negligible amount of silicon nitride is lost. After the selective etch, sidewalls 240 and 244 form part of a fourth hard mask. Then, an etch process uses the fourth hard mask to etch through exposed portions silicon nitride layer 210 and down through buffer oxide layer 208, polysilicon layer 206, and gate oxide layer 204, to substrate 202 (126). The etch process also reduces the oxide of the fourth hard mask, but since the fourth hard mask is formed from sufficiently thick material, some material remains. The resulting patterned stacks of layers having width d6 and spaced by width d7 or width d8 are illustrated in FIG. 2L.

Figure 2M:
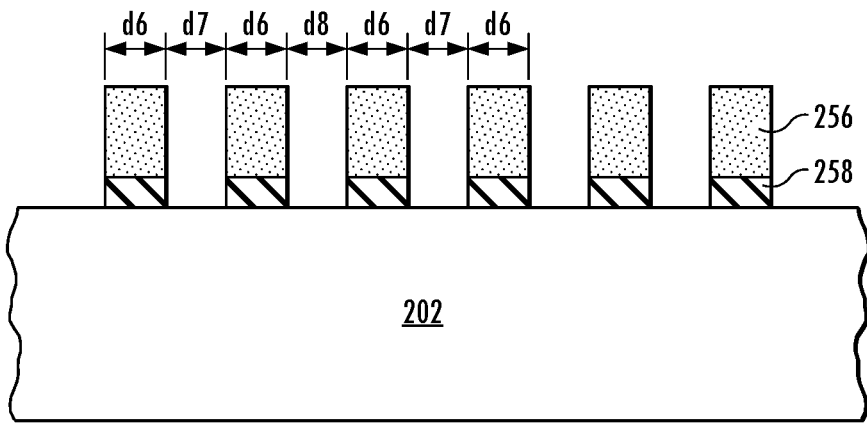

Referring to FIGS. 1B and 2M, the oxide, silicon nitride, and buffer oxide hard mask are removed by another removal process, thereby revealing the final polysilicon and gate oxide features on substrate 202 (128). The hard mask is removed using wet or dry processing techniques that are highly selective between oxide and silicon nitride with respect to polysilicon. The final critical dimension of polysilicon 256 and gate oxide 258 is width d6 and the polysilicon and gate oxide features are separated from adjacent polysilicon and gate oxide features by width d7 or width d8.

Although FIGS. 2A-2M describe using two iterations of forming a polysilicon hard mask and growing oxide using the polysilicon hard mask to reduce the CD of a final polysilicon and gate oxide feature, one of skill in the art will appreciate that the teachings herein can be adapted to further reduce the CD of a feature formed from different materials using additional iterations of forming a polysilicon hard mask and growing oxide using the polysilicon hard mask to reduce the CD of the feature.

Thus, techniques for forming semiconductor structures having a CD smaller than the minimum lithographic CD capability of an available lithography tool used to form structures on a substrate have been described. The technique reduces the cost of manufacturing semiconductor devices with structures having CDs at the limits of the state-of-the-art lithography tools. The technique may be used to reduce any delay from obtaining state-of-the-art lithography tools that are in short supply. The description of the invention set forth herein is illustrative and is not intended to limit the scope of the invention as set forth in the following claims. For example, while the invention has been described in an embodiment in which a gate electrode of a MOS transistor is formed, one of skill in the art will appreciate that the teachings herein can be utilized to form other features of a semiconductor device (e.g., active area, contact or metal CD, or other features). In addition, while the invention has been described in an embodiment in which structures are formed that have a CD smaller than the minimum lithographic CD capability of an available lithography tool, in other embodiments, structures are formed with other CDs by modifying the CD of the lithography steps or the thickness of the oxide grown on a polysilicon hard mask of the technique. The terms "first," "second," "third," and so forth, as used in the claims, unless otherwise clear by context, distinguish between different items in the claims and do not otherwise indicate or imply any order in time, location, or quality. For example, "a first step," and "a second step," do not indicate or imply that the first step occurs in time before the second step. Variations and modifications of the embodiments disclosed herein may be made based on the description set forth herein, without departing from the scope of the invention as set forth in the following claims.

What is claimed is:

1. A method for manufacturing an integrated circuit, the method comprising:

forming a first hard mask on a substrate by patterning a first layer of a first material, the first hard mask having first features with a first critical dimension;

forming a second hard mask of a second material on the substrate by chemically modifying the first hard mask, the second hard mask having second features with a second critical dimension, the second critical dimension being smaller than the first critical dimension;

forming a third hard mask by patterning a second layer of the first material on the substrate, the third hard mask having third features with the second critical dimension; and forming a fourth hard mask of the second material on the substrate by chemically modifying the third hard mask, the fourth hard mask having fourth features with a third critical dimension, the third critical dimension being smaller than the second critical dimension, wherein chemically modifying the first hard mask generates a chemically modified portion and a non-modified portion, and wherein forming the second hard mask comprises removing the non-modified portion, thereby generating the second hard mask of the second material.

2. The method as recited in claim 1 wherein the first hard mask is formed using a lithography process having a minimum feature size of the first critical dimension.

3. The method as recited in claim 1 wherein the first material is polysilicon and the second material is thermally-grown oxide, the second critical dimension is approximately half the first critical dimension and the third critical dimension is approximately one fourth the first critical dimension.

4. The method as recited in claim 1 further comprising:

forming the first hard mask of sacrificial polysilicon on a substrate stack including a buffer oxide layer, an etch stop layer formed below the buffer oxide layer, a second buffer oxide layer formed below the etch stop layer, and a polysilicon layer formed above a gate oxide layer and below the second buffer oxide layer.

5. The method as recited in claim 1 wherein chemically modifying the third hard mask generates a second chemically modified portion and a second non-modified portion and forming the fourth hard mask comprises:

removing the second non-modified portion thereby generating the fourth hard mask of the second material.

6. The integrated circuit manufactured by the method as recited in claim 1.

7. The method as recited in claim 1 wherein forming the second hard mask comprises:

growing oxide using the first layer; and removing an oxide cap on a mandrel formed from the first material, wherein the non-modified portion includes the mandrel and removing the non-modified portion comprises removing the mandrel, thereby forming the second hard mask from oxide sidewalls disposed adjacent to sidewalls of the mandrel.

8. The method as recited in claim 7 wherein forming the third hard mask comprises:

etching a buffer oxide layer below the second hard mask;

removing the second hard mask; and forming a second sacrificial layer of the first material on the buffer oxide layer;

planarizing the second sacrificial layer; and removing the buffer oxide layer to reveal a second mandrel formed of the second sacrificial layer.

9. The method as recited in claim 8 wherein forming the fourth hard mask comprises:

growing an oxide layer using the second sacrificial layer;

removing a second oxide cap on the second mandrel, the second mandrel having second sidewalls coated in thermally grown oxide; and removing the second mandrel, thereby forming the fourth hard mask from second oxide sidewalls disposed adjacent to the second sidewalls of the second mandrel prior to removal.

10. The method as recited in claim 1 further comprising:

etching using the fourth hard mask to generate a final structure on the substrate having the third critical dimension.

11. The method as recited in claim 10 wherein the final structure includes a polysilicon layer and a gate oxide layer having a final critical dimension smaller than one half the first critical dimension.

12. A method for manufacturing an integrated circuit, the method comprising:

forming a first hard mask by lithographically patterning a first sacrificial layer formed on a substrate, the first hard mask having first features with a first critical dimension; and serially forming additional hard masks by chemically modifying the first hard mask and a first intermediate hard mask of the additional hard masks, wherein a final hard mask of the additional hard masks has a second critical dimension, the second critical dimension being smaller than one half the first critical dimension.

13. The method as recited in claim 12 wherein the first features are spaced by a distance equal to the first critical dimension.

14. The method as recited in claim 12 wherein the first hard mask is formed using a lithography tool capable of generating a minimum feature size of the first critical dimension.

15. The method as recited in claim 12 wherein serially forming the additional hard masks comprises:

chemically modifying the first hard mask to form a chemically modified portion and a non-modified portion, the chemically modified portion including a cap portion and sidewall portions;

removing the cap portion without removing the sidewall portions; and removing any remaining first material, thereby forming an intermediate hard mask from the sidewall portions.

16. The method as recited in claim 12 wherein serially forming the additional hard masks comprises:

etching a buffer oxide layer on the substrate using a second intermediate hard mask;

removing the second intermediate hard mask, thereby exposing a remaining pattern of the buffer oxide layer; and using the remaining pattern of the buffer oxide layer to generate the first intermediate hard mask.

17. The method as recited in claim 12 wherein serially forming the additional hard masks comprises:

planarizing a second sacrificial layer formed on the substrate using a patterned buffer oxide layer formed on the substrate beneath the second sacrificial layer;

removing the patterned buffer oxide layer to form the first intermediate hard mask from the second sacrificial layer; and chemically modifying the first intermediate hard mask to form a second chemically modified portion and a second non-modified portion, the second chemically modified portion including a second cap portion and second sidewall portions;

removing the second cap portion without removing the second sidewall portions; and removing any remaining first material of the second sacrificial layer, thereby forming the final hard mask.

18. A method for manufacturing an integrated circuit, the method comprising:

using a lithographic process defined by a first minimum feature size of a first critical dimension to form a first hard mask from a first sacrificial layer on a substrate; and generating a final hard mask using the first hard mask, wherein the final hard mask has a second critical dimension, the second critical dimension being smaller than one half the first critical dimension, wherein the final hard mask is generated by serially reducing corresponding minimum feature sizes by chemical modification of the first sacrificial layer formed on the substrate and an additional sacrificial layer formed on the substrate.

19. The integrated circuit manufactured by the method as recited in claim 18.

20. The method as recited in claim 18 wherein the first sacrificial layer and the additional sacrificial layer are polysilicon and are chemically modified to grow oxide used to form the first hard mask and the final hard mask, respectively.

* * * * *